United States Patent
Schiller et al.

(10) Patent No.: US 9,407,244 B2
(45) Date of Patent: Aug. 2, 2016

(54) DEVICE FOR GENERATING A TIME SIGNAL, AND SYSTEM COMPRISING SUCH A DEVICE

(71) Applicant: Beckhoff Automation GmbH, Verl (DE)

(72) Inventors: Frank Schiller, Nürnberg (DE); Martin Früchtl, Bad Sassendorf (DE)

(73) Assignee: BECKHOFF AUTOMATION GMBH, Verl (DE)

( * ) Notice: Subject to any disclaimer, the term of this patent is extended or adjusted under 35 U.S.C. 154(b) by 0 days.

(21) Appl. No.: 14/578,780

(22) Filed: Dec. 22, 2014

(65) Prior Publication Data
US 2015/0188524 A1    Jul. 2, 2015

(30) Foreign Application Priority Data
Dec. 27, 2013 (DE) .......................... 10 2013 227 177

(51) Int. Cl.
*H03L 7/00* (2006.01)
*H03K 3/84* (2006.01)

(52) U.S. Cl.
CPC ... *H03K 3/84* (2013.01); *H03L 7/00* (2013.01)

(58) Field of Classification Search
USPC .......................... 327/105–123, 141, 144–163; 331/15–17; 375/373–376
See application file for complete search history.

(56) References Cited

U.S. PATENT DOCUMENTS

| | | | | | |
|---|---|---|---|---|---|
| 4,494,021 | A | * | 1/1985 | Bell | H03K 3/0315 327/259 |
| 6,075,395 | A | * | 6/2000 | Saeki | H03K 5/135 327/161 |
| 7,130,368 | B1 | * | 10/2006 | Aweya | H03L 7/085 375/326 |
| 2006/0242445 | A1 | * | 10/2006 | Aweya | H03L 7/08 713/400 |
| 2007/0075785 | A1 | * | 4/2007 | Kossel | H03L 7/089 331/16 |
| 2011/0268097 | A1 | | 11/2011 | Agrawala et al. | |
| 2015/0341041 | A1 | * | 11/2015 | Balachandran | H03L 7/099 327/156 |

OTHER PUBLICATIONS

Endrun Technologies, , "Precision Time Protocol (PTP)", PTP/IEEE-1588 Slave Software & Hardware, PTP White Paper, http://www.endruntechnologies.com/ptp-slave.htm, Nov. 2009, 1-10.

Schmidt, Stephan , "Time synchronization", Main seminar on communication standards in medical engineering, 2010, 1-15.

* cited by examiner

*Primary Examiner* — Brandon S Cole
(74) *Attorney, Agent, or Firm* — Dorsey & Whitney LLP

(57) ABSTRACT

A device comprises a first time generator for generating an internal time signal, a unit for receiving an external time signal at discrete synchronization times and a generator unit for producing a generated time signal, which generator unit is designed to calculate on the basis of an algorithm the generated time signal at a determination time between two synchronization times from a value of the external time signal at a previous synchronization time and from a value of the internal time signal at the determination time. Said algorithm includes an assumption of a proportionality between an advance in the internal time signal and an advance in the external time signal.

13 Claims, 3 Drawing Sheets

DEVICE FOR GENERATING A TIME SIGNAL, AND SYSTEM COMPRISING SUCH A DEVICE

CROSS REFERENCE TO RELATED APPLICATION

This application claims priority to German Patent Application No. DE 10 2013 227 177.8, filed Dec. 27, 2013, entitled VORRICHTUNG ZUM GENERIEREN EINES ZEITSIGNALS MIT SOLCHER VORRICHTUNG.

FIELD

The present invention relates to a device and a system.

BACKGROUND

In the prior art, many technical devices need a time signal to perform their intended functions. The time signal may be used for monitoring delays, for instance during communication or processing of data, for calculating time differences or for defining points in time.

It is known that in safety-related technical devices, a time signal used by the device must be safeguarded. In this context, the term safety means in particular a robustness to the occurrence of random unintentional faults rather than protection against targeted attacks in the sense of security. To achieve this, it may be necessary, for instance, for a time-signal generator integrated in the device to have a redundant design, which is associated with high costs.

The document by Stephan Schmidt, "Zeitsynchronisation" (Time Synchronization), Main Seminar on Communications Standards in Medical Engineering, Institute for Telematics, University of Lübeck (2010), describes a range of known protocols and standards for time synchronization.

SUMMARY

It is an object of the present invention to provide an improved device. It is also an object of the present invention to provide an improved system comprising a device.

In an embodiment, a device comprises a first time generator for generating an internal time signal, a unit for receiving an external time signal at discrete synchronization times and a generator unit for producing a generated time signal, which generator unit is designed to calculate on the basis of an algorithm the generated time signal at a determination time between two synchronization times from a value of the external time signal at a previous synchronization time and from a value of the internal time signal at the determination time, wherein the algorithm includes an assumption of a proportionality between an advance in the internal time signal and an advance in the external time signal.

In an embodiment, a system comprises a first device of the aforementioned type and a second device comprising a second time generator. In this system, the second device is designed to transmit as the external time signal a time signal produced by the second time generator to the first device.

BRIEF DESCRIPTION OF THE DRAWINGS

The invention is explained in more detail below with reference to drawings which each show a schematic diagram and in which.

DETAILED DESCRIPTION

Figure 1:
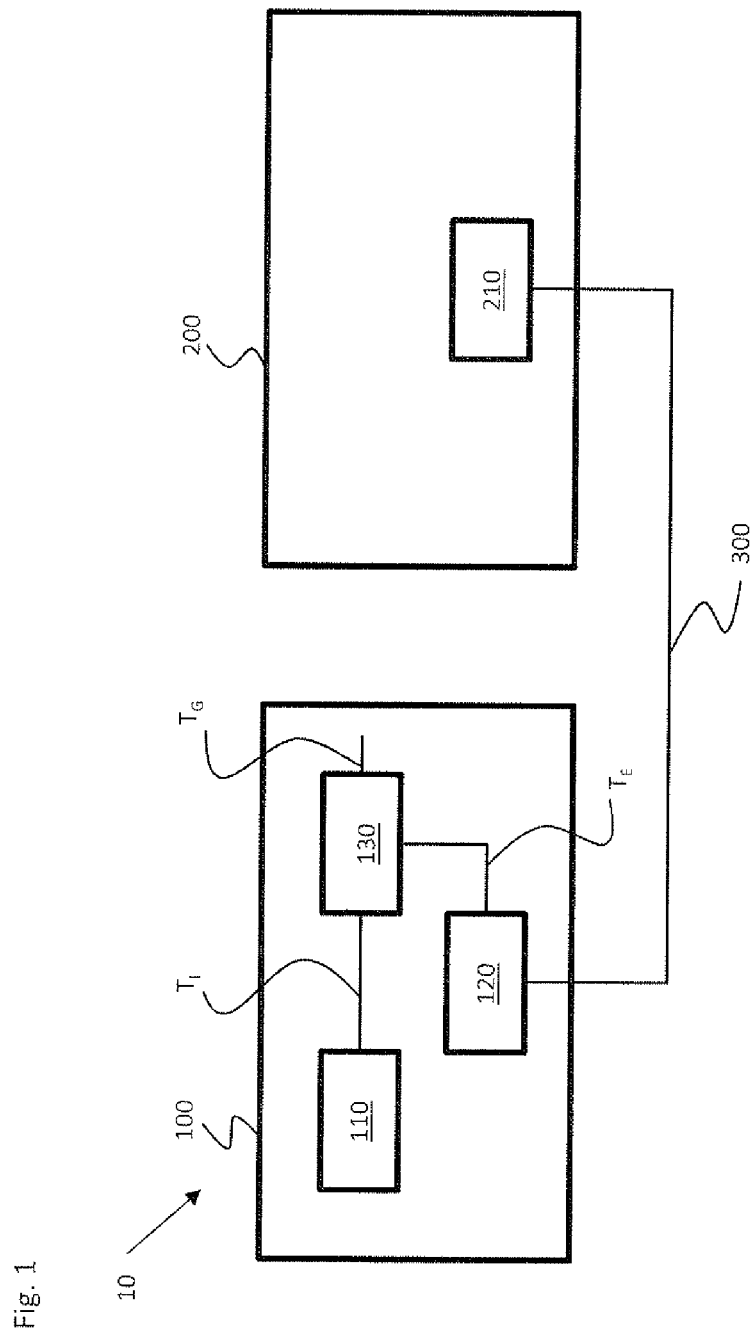
FIG. 1 is a system having a first device and a second device, which are connected to one another via a communications link.

FIG. 1 shows a block diagram of a system 10. The system 10 may be, for instance, part of an industrial plant, part of an automation system or part of a computer network. The system 10 may be part of a safety-related or safety-critical environment. For instance, the system 10 may be used to perform and to monitor safety-critical or safety-related functions and processes. It may be necessary for the system 10 to meet specified safety requirements and safety conditions, so for example to have a robustness to an occurrence of random unintentional faults.

The system 10 comprises a first device 100. The first device 100 may be a computer or a control device, for example. The first device 100 can be provided to perform and/or monitor safety-critical and/or safety-related processes, operations and functions. The first device 100 can be used to control and/or monitor further equipment and systems not shown in FIG. 1.

The functions, operations and processes performed by the first device 100 can have a time reference. This can mean that functions performed by the first device 100 must be performed at specific times, after specific time periods have elapsed or for specific time lengths.

In order to perform these time-referenced functions, the first device needs a reliable time signal. The first device 100, however, does not have a dedicated time generator designed to produce a sufficiently reliable and safe time signal. This means that the first device 100 can have a simple and low-cost design.

The system 10 comprises a second device 200 in addition to the first device 100. The second device 200 has a second time generator 210, which is designed to produce a reliable and safe time signal. The second time generator 210 of the second device 200 can comply with standards for safety-critical or safety-related applications. The second time generator 210 can have, for example, a redundant design and be equipped with at least two hardware timing circuits.

The second device 200 of the system 10 can transmit a time signal produced by the second time generator 210 of the second device 200 to the first device 100 of the system 10. For this purpose, the first device 100 and the second device 200 of the system 10 are connected to one another via a communications link 300. The communications link 300 may be, for example, a wired or wireless communications link. The communications link 300 can be designed such that safety-related requirements are met. For instance, the communications link 300 can have a redundant design and/or include a use of checksums.

The second device 200 can be connected via further communications links to further devices of the system 10 in order to transmit the time signal produced by the second time generator 210 of the second device 200 also to the further devices.

The first device 100 comprises a unit 120 for receiving an external time signal. The unit 120 is intended to receive as the external time signal $T_E$ the time signal produced by the second time generator 210 of the second device 200 and transmitted by the second device 200 via the communications link 300.

The first device 100 also comprises a first time generator 110. The first time generator 110 is designed to produce an internal time signal $T_I$. The first time generator 110 can have a less stringent design in terms of safety-related requirements than the second time generator 210 of the second device 200. The internal time signal $T_I$ produced by the first time generator 110 can have a lower accuracy and a lower stability than the external time signal $T_E$.

The unit 120 for receiving the external time signal $T_E$ receives the external time signal $T_E$ solely at discrete synchronization times $t_n$. These synchronization times $t_n$ can occur equidistantly, i.e. each occur at the same time interval apart. The synchronization times $t_n$, however, can also occur at varying time intervals.

In order to perform its functions, the device 100 of the system 10 may need a time signal also at times that lie between two synchronization times $t_n$. The first time generator 110 of the first device 100 can provide the internal time signal $T_I$ at short intervals also between the synchronization times $t_n$. The accuracy of the internal time signal $T_I$, however, may not be sufficient for the functions performed by the first device 100. Therefore the first device 100 comprises a generator unit 130, which is designed to generate a generated time signal $T_G$, which approximates the external time signal $T_E$ between the synchronization times $t_n$.

The approximation of the external time signal $T_E$ by the time signal $T_G$ generated by the generator unit 130 is based on the assumption that an advance in the internal time signal $T_I$ produced by the first time generator 110 of the first device 100 is proportional to an advance of the external time signal $T_E$ at least over limited time periods. In particular, the approximation is based on the assumption that this proportionality lasts over a period of three consecutive synchronization times $t_n$.

Figure 2:
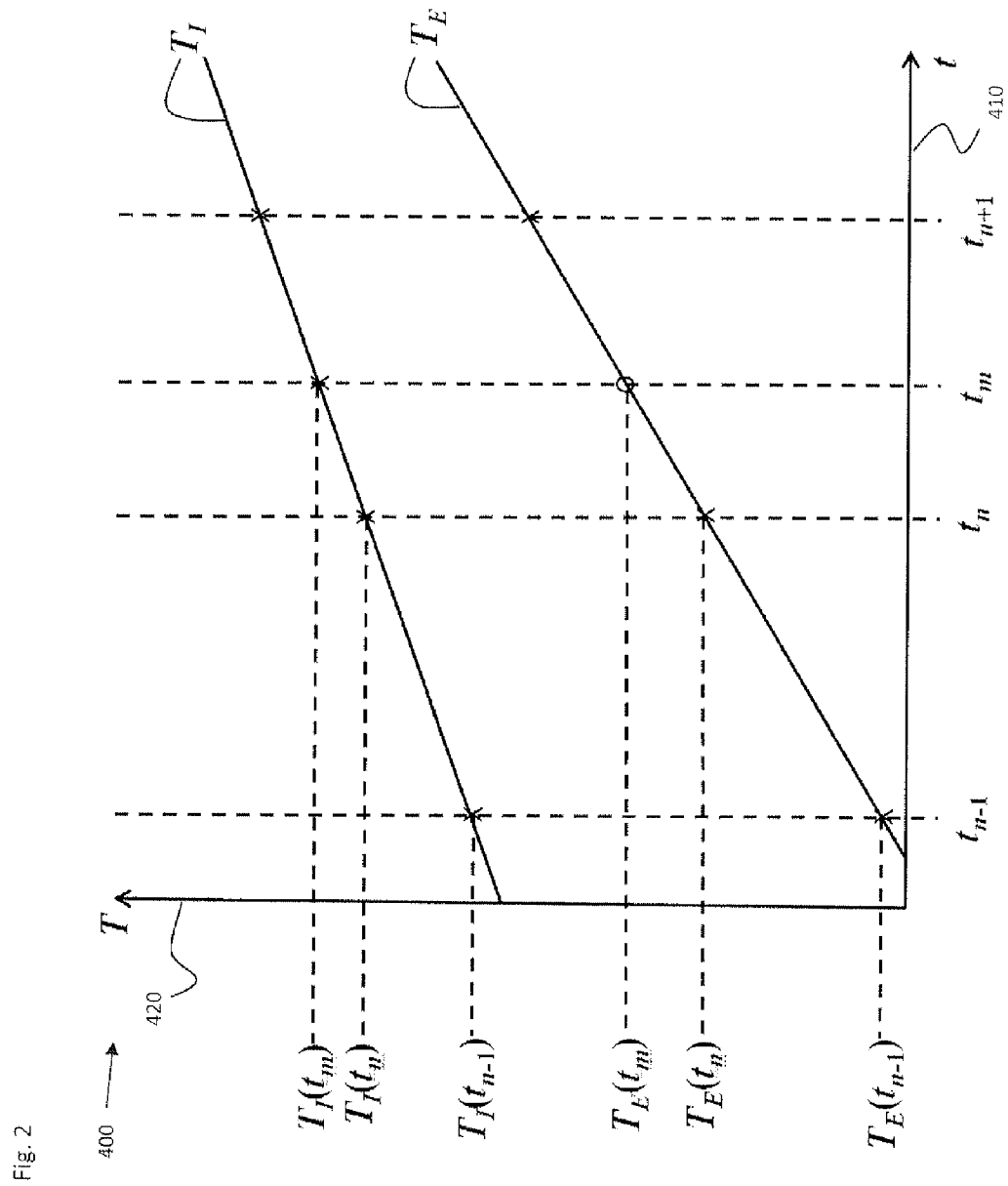
FIG. 2 is a first time-generator diagram.

FIG. 2 shows a first time-generator diagram 400. An advancing time 410 is shown on a horizontal axis of the first time-generator diagram 400. Time signal values 420 are plotted on a vertical axis of the first time-generator diagram 400. A first graph shows the advance in the external time signal $T_E$ over time. A second graph shows the advance in the internal time signal $T_I$ over time.

The external time signal $T_E$ advances in a linear manner. The increase in the external time signal $T_E$ is constantly proportional to the time that has actually elapsed. The gradient of the graphs of the external time signal $T_E$ in the first time-generator diagram 400 is constant. In particular, the advance in the external time signal $T_E$ in a time period between the last synchronization time $t_n$ and a determination time $t_m$, which lies between the last synchronization time $t_n$ and a next synchronization time $t_{n+1}$, equals the advance in the external time signal $T_E$ in a previous time interval between a next-to-last synchronization time $t_{n-1}$ and the last synchronization time $t_n$. The following relationship thus applies:

$$\frac{T_E(t_m) - T_E(t_n)}{t_m - t_n} = \frac{T_E(t_n) - T_E(t_{n-1})}{t_n - t_{n-1}}. \tag{1}$$

The value $T_E(t_m)$ of the external time signal $T_E$ at the determination time $t_m$ is not available to the first device 100. It is therefore meant to be approximated by the generated time signal $T_G$.

It can be assumed for the internal time signal $T_I$ that the advance in the internal time signal $T_I$ over time progressed from the last synchronization time $t_n$ until the present determination time $t_m$ at the same gradient as the advance in the internal time signal $T_I$ in the previous time interval between the next-to-last synchronization time $t_{n-1}$ and the last synchronization time $t_n$:

$$\frac{T_I(t_m) - T_I(t_n)}{t_m - t_n} = \frac{T_I(t_n) - T_I(t_{n-1})}{t_n - t_{n-1}}. \tag{2}$$

If the conditions (1) and (2) are satisfied then the value of the external time signal $T_E$ at the determination time $t_m$ can expressed as $$T_E(t_m) = T_E(t_n) + \frac{T_I(t_m) - T_I(t_n)}{T_I(t_n) - T_I(t_{n-1})}(T_E(t_n) - T_E(t - n_{n-1})). \tag{3}$$

This relationship enables the value of the external time signal $T_E$ at the determination time tm to be approximated from the values known to the first device 100 of the external time signal $T_E$ at previous synchronization times $t_{n-1}$, $t_n$ and from the values known anyway to the first device 100 of the internal time signal $T_I$ at the determination time $t_m$ and at the previous synchronization times $t_{n-1}$, $t_n$.

At the synchronization times $t_n$, the value of the external time signal $T_E$ is known anyway. Hence the generator unit 130 of the first device 100 can produce the generated time signal $T_G$ as follows:

$$T_G(t_m) = \begin{cases} T_E(t_m) \text{ for } t_m = \ldots, t_{n-1}, t_n, t_{n+1}, \ldots \\ T_E(t_n) + \dfrac{T_E(t_n) - T_E(t_{n-1})}{T_I(t_n) - T_I(t_{n-1})}(T_I(t_m) - T_I(t_n)) \text{ else} \end{cases}. \tag{4}$$

At the synchronization times $t_n$, the generated time signal $T_G$ is set equal to the external time signal $T_E$. At all other determination times $t_m$, the generated time signal $T_G$ approximates the external time signal $T_E$.

Figure 3:
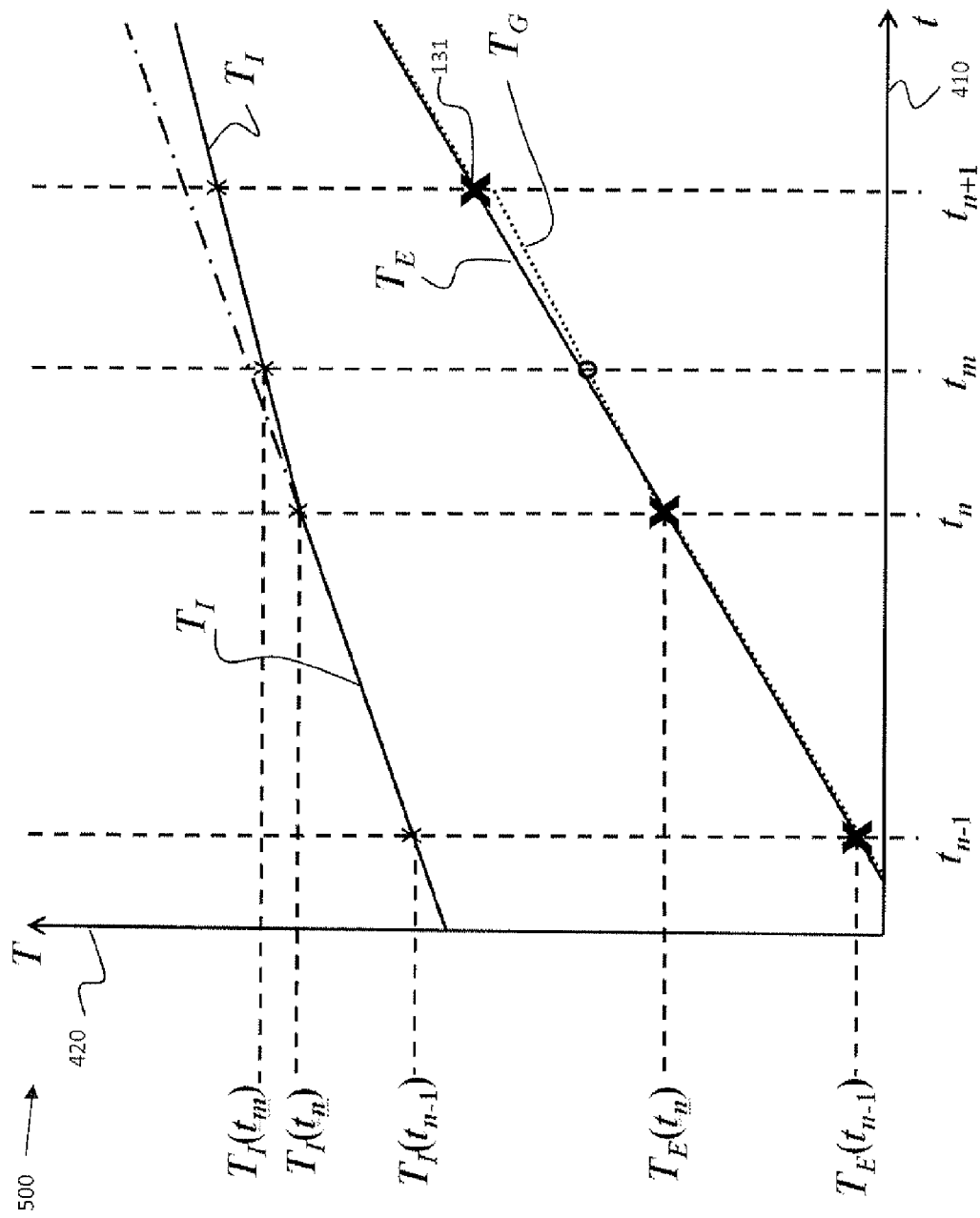
FIG. 3 is a second time-generator diagram.

FIG. 3 shows a second time-generator diagram 500. The advancing time 410 is shown on a horizontal axis of the second time-generator diagram 500. The time signal values 420 of the internal time signal $T_I$, of the external time signal $T_E$ and of the generated time signal $T_G$ are plotted on a vertical axis of the second time-generator diagram 500.

In the example shown for the time-generator diagram 500, the progress of the internal time signal $T_I$ produced by the first time generator 110 of the first device 100 is not entirely constant over a long period of time. Approximately at the synchronization time $t_n$, the progress of the internal time signal $T_I$ slows down slightly compared with the curve which is shown dashed and which would have been expected according to the rate of advance of the internal time signal $T_I$ during the intervals preceding the synchronization time $t_n$.

Owing to the slower progress of the internal time signal $T_I$ since the last synchronization time $t_n$, the approximation of the external time signal $T_E$ by the generated time signal $T_G$ according to equation (4) at determination time $t_m$ between the last synchronization time $t_n$ and the next synchronization time $t_{n+1}$ delivers a value that differs from the value of the external time signal $T_E$. This error increases between the last synchronization time $t_n$ and the next synchronization time $t_{n+1}$.

At the next synchronization time $t_{n+1}$, the generated time signal $T_G$ is set equal to the external time signal $T_E$ as given by equation (4), with the result that the generated time signal $T_G$ experiences a step correction 131.

From the next synchronization time $t_{n+1}$ onwards, the approximation of the external time signal $T_E$ by the generated time signal $T_G$ in accordance with equation (4) uses the now correct gradient of the internal time signal $T_I$ between the last synchronization time $t_n$ and the next synchronization time $t_{n+1}$, with the result that the approximation of the external time signal $T_E$ by the generated time signal $T_G$ again delivers very accurate values from the next synchronization time $t_{n+1}$ onwards.

An advantage of the approximation of the external time signal $T_E$ by the generated time signal $T_G$ in accordance with equation (4) is hence that long-term changes in the rate of progress of the internal time signal $T_I$ do not have long-term effects on the quality of the approximation.

A first quality value $G_1$ can be calculated at the synchronization time $t_{n+1}$ from the size of the error between the value of the generated time signal $T_G$ approximating the external time signal $T_E$ and the value of the external time signal $T_E$:

$$G_1(t_{n+1}) = T_G(t_{n+1}) - T_E(t_{n+1}) \quad (5)$$
$$= \frac{T_I(t_{n+1}) - T_I(t_n)}{T_I(t_n) - T_I(t_{n-1})}(T_E(t_n) - T_E(t_{n-1})) -$$
$$(T_E(t_{n+1}) - T_E(t_n)).$$

The first quality value $G_1$ ideally has a value close to 0. If the magnitude of the first quality value $G_1$ exceeds a specified first threshold value $S_1$ then the quality and accuracy of the generated time signal $T_G$ may in some circumstances no longer be sufficient for the purposes of the first device 100 of the system 10. In this case, the first device 100 can produce a control signal, which can be used, for example, to take equipment and systems connected to the first device 100 of the system 10 into a safe state. Taking the equipment and systems into a safe state can involve shutting down the equipment and systems or involve an alternative way of taking the equipment and systems into an unproductive state. The control signal produced by the first device 100 can also be used to produce a fault message or for another response.

In addition, a second quality value $G_2$ can be calculated from the values of the generated time signal $T_G$ and of the external time signal $T_E$ at the synchronization times $t_{n-1}$, $t_n$, $t_{n+1}$:

$$G_2(t_{n+1}) = \frac{T_I(t_{n+1}) - T_I(t_n)}{T_I(t_n) - T_I(t_{n-1})} \cdot \frac{T_E(t_n) - T_E(t_{n-1})}{T_E(t_{n+1}) - T_E(t_n)}. \quad (6)$$

The second quality value $G_2$ gives a measure of the proportionality between the internal time signal $T_I$ and the external time signal $T_E$ and should have a value as close as possible to 1. The first device 100 can compare the second quality value $G_2$ at the synchronization times $t_n$ with the value 1. If the second quality value $G_2$ differs from the value 1 by more than a specified second threshold value $S_2$ then the first device 100 can produce a control signal, which can be used in a similar way to the control signal produced on the basis of the first quality value $G_1$ to initiate a safe response.

Between the synchronization times $t_n$, the generator unit 130 of the first device 100 of the system 10 can check the plausibility of the values of the generated time signal $T_G$. At each determination time $t_m$, the value of the generated time signal $T_G$ should be greater than or at least equal to the value of the generated time signal $T_G$ at a previous determination time $t_{m-1}$. It is clear from equation (4) that this requirement is equivalent to the requirement that the value of the internal time signal $T_I$ at every determination time $t_m$ is greater than or equal to the value of the internal time signal $T_I$ at the previous determination time $t_{m-1}$. This can be used to define a third quality value $G_3$:

$$G_3(t_m) = T_I(t_m) T_I(t_{m-1}). \quad (7)$$

The third quality value $G_3$ is meant to have a value greater than or equal to 0 at every determination time $t_m$. If the third quality value $G_3$ has a value less than 0 then the first device 100 of the system 10 can conclude that there is a fault and can produce a control signal, which can be used, for example, to initiate a safe response.

Calculation of the first quality value $G_1$ and of the second quality value $G_2$ is simplified if the synchronization times $t_n$ occur equidistantly, i.e. each occur at the same time interval apart. In this case, the following is true:

$$t_{n+1} - t_n = t_n - t_{n-1}. \quad (8)$$

If moreover the external time signal $T_E$ progresses at a constant rate, then the following is also true:

$$T_E(t_{n+1}) T_E(t_n) = T_E(t_n) - T_E(t_{n-1}). \quad (9)$$

Calculation of the first quality value $G_1$ is then simplified in accordance with equations (5), (8) and (9) to $$G_1(t_{n+1}) = \left(\frac{T_I(t_{n+1}) - T_I(t_n)}{T_I(t_n) - T_I(t_{n-1})} - 1\right)(T_E(t_{n+1}) - T_E(t_n)). \quad (5')$$

Calculation of the second quality value $G_2$ is then simplified in accordance with equations (6), (8) and (9) to $$G_2(t_{n+1}) = \frac{T_I(t_{n+1}) - T_I(t_n)}{T_I(t_n) - T_I(t_{n+1})}. \quad (6')$$

The first time generator 110 of the first device 100 of the system 10 and/or the second time generator 210 of the second device 200 of the system 10 can be designed as binary counters of finite bit length. In this case, the values of the internal time signal $T_I$ and of the external time signal $T_E$ can overrun. The internal time signal $T_I$ produced by the first time generator 110 of the first device 100 can have a bit length of $l_I$. The external time signal $T_E$ produced by the second time generator 210 of the second device 200 can have a bit length of $l_E$. In order to take into account potential overruns of the internal time signal $T_I$ and of the external time signal $T_E$, the calculation of the generated time signal $T_G$, of the first quality value $G_1$, of the second quality value $G_2$ and of the third quality value $G_3$ in accordance with equations (4), (5), (6) and (7) can be modified as follows:

$$T_G(t_m) = \begin{cases} T_E(t_m) \text{ for } t_m = \ldots, t_{n-1}, t_n, t_{n+1}, \ldots \\ T_E(t_n) + \frac{(T_E(t_n) - T_E(t_{n-1}) + 2^{l_I}) \bmod 2^{l_I}}{(T_I(t_n) - T_I(t_{n-1}) + 2^{l_I}) \bmod 2^{l_I}} \, ; \\ (T_I(t_m) - T_I(t_n) + 2^{l_E}) \bmod 2^{l_E} \text{ else} \end{cases} \quad (4')$$

$$G_1(t_{n+1}) = \quad (5'')$$
$$\frac{(T_I(t_{n+1}) - T_I(t_n) + 2^{l_I}) \bmod 2^{l_I}}{(T_I(t_n) - T_I(t_{n-1}) + 2^{l_I}) \bmod 2^{l_I}}(T_E(t_n) - T_E(t_{n-1}) + 2^{l_E}) \bmod 2^{l_E} -$$
$$(T_E(t_{n+1}) - T_E(t_n) + 2^{l_E}) \bmod 2^{l_E};$$

$$G_2(t_{n+1}) = \quad (6'')$$
$$\frac{(T_I(t_{n+1}) - T_I(t_n) + 2^{l_I}) \bmod 2^{l_I}}{(T_I(t_n) - T_I(t_{n-1}) + 2^{l_I}) \bmod 2^{l_I}} \cdot \frac{(T_E(t_n) - T_E(t_{n-1}) + 2^{l_E}) \bmod 2^{l_E}}{(T_E(t_{n+1}) - T_E(t_n) + 2^{l_E}) \bmod 2^{l_E}};$$

-continued $$G_3(t_m) = (T_I(t_m) - T_I(t_{m-1}) + 2^{l_I}) \bmod 2^{l_I} \qquad (7')$$

where mod denotes the modulo operator.

In an embodiment, a device comprises a first time generator for generating an internal time signal, a unit for receiving an external time signal at discrete synchronization times and a generator unit for producing a generated time signal, which generator unit is designed to calculate on the basis of an algorithm the generated time signal at a determination time between two synchronization times from a value of the external time signal at a previous synchronization time and from a value of the internal time signal at the determination time, wherein the algorithm includes an assumption of a proportionality between an advance in the internal time signal and an advance in the external time signal. The time signal generated by the generator unit of this device can advantageously approximate the external time signal sufficiently reliably for the time signal generated by the generator unit to be used to perform time-dependent safety-related functions. Moreover, the first time generator of the device advantageously does not need to meet high safety and reliability requirements. This means that the device can advantageously have a simple and low-cost design.

In an embodiment of the device, the generator unit is designed to set the generated time signal equal to the external time signal at the synchronization times. This advantageously corrects any error arising between the synchronization times that exists between the time signal generated by the generator unit of the device and the external time signal at the synchronization times. This advantageously ensures that the time signal generated by the generator unit does not depart too far from the external time signal even over long time periods.

In an embodiment of the device, the algorithm includes the assumption that a ratio of advances in the external time signal and in the internal time signal between the last synchronization time and the determination time equals a ratio of advances in the external time signal and in the internal time signal between the next-to-last synchronization time and the last synchronization time. If this assumption is valid, it is advantageously possible to extrapolate the advance in the external time signal from the advance in the internal time signal. An advantage of the algorithm used by the generator unit is that it is based solely on the time interval between the next-to-last synchronization time and the last synchronization time. This means that longer-term variations in the uniformity of the advance in the internal time signal do not reduce the quality of the approximation of the external time signal by the time signal generated by the generator unit.

In an embodiment, the algorithm is designed to calculate the generated time signal at the determination time as the sum of a value of the external time signal at the last synchronization time and of a product formed by multiplying the advance in the internal time signal between the last synchronization time and the determination time with the ratio of the advance in the external time signal between the next-to-last synchronization time and the last synchronization time to the advance in the internal time signal between the next-to-last synchronization time and the last synchronization time. The generator unit of the device thereby advantageously enables a reliable approximation of the external time signal by the time signal generated by the generator unit if the internal time signal of the first time generator of the device advances sufficiently constantly over at least a time period of three synchronization times.

In an embodiment of the device, the generator unit is designed to take into account an overrun of the value of the external time signal and/or of the value of the internal time signal. The internal time generator and/or an external time generator producing the external time signal can then advantageously be designed as counters of finite bit length.

In an embodiment of the device, the generator unit is designed to calculate a first quality value at a synchronization time. The first quality value is here calculated as the difference of the value of the generated time signal, which value is calculated for the synchronization time on the basis of the algorithm, and the value of the external time signal at the synchronization time. The first quality value advantageously provides information about an error between the time signal generated by the generator unit and the external time signal at the synchronization time. The first quality value thereby allows an assessment of the quality of the approximation of the external time signal by the time signal generated by the generator unit.

In an embodiment of the device, the device is designed to produce a control signal if the first quality value differs from the value zero by more than a specified first threshold value. This advantageously enables the device to initiate a response if the quality of the approximation of the external time signal by the time signal generated by the generator unit does not exhibit a desired quality quantified by the first threshold value. The control signal that can be produced by the device can be used, for example, to take safety-critical equipment and systems into a safe state. For instance, the control signal that can be produced by the device can be used to shut down safety-critical equipment and systems.

In an embodiment of the device, the generator unit is designed to calculate a second quality value at a synchronization time. The second quality value is here calculated as the product of the ratio of the advance in the internal time signal between the last synchronization time and the present synchronization time to the advance in the internal time signal between the next-to-last synchronization time and the last synchronization time, and the ratio of the advance in the external time signal between the next-to-last synchronization time and the last synchronization time to the advance in the external time signal between the last synchronization time and the present synchronization time. The second quality value that can be calculated by the generator unit of the device constitutes a measure of a proportionality between the internal time signal of the device and the external time signal receivable by the device. The second quality value enables the device to take appropriate action if the advance in the internal time signal of the device is not sufficiently proportional to the advance in the external time signal.

In an embodiment of the device, the device is designed to produce a control signal if the second quality value differs from the value one by more than a specified second threshold value. The control signal that can be produced by the device can be used, for example, to take equipment and systems connected to the device into a safe state. The control signal that can be produced by the device hence enables the device to respond by appropriate action to there not being a desired proportionality between the advance in the internal time signal and the advance in the external time signal.

In an embodiment of the device, the generator unit is designed to calculate a third quality value at the determination time. The third quality value is here calculated as the difference between the value of the internal time signal at the determination time and a value of the internal time signal at a previous determination time. The third quality value that can be calculated by the generator unit of the device allows a plausibility check of the values of the internal time signal produced by the internal time generator of the device and hence also of the values of the time signal generated by the generator unit.

In an embodiment of the device, the device is designed to produce a control signal if the third quality value is not greater than or equal to zero. The control signal that can be produced by the device advantageously enables the device to take appropriate action if the values of the internal time signal produced by the first time generator of the device are not plausible. The control signal that can be produced by the device can be used, for example, to take equipment or systems connected to the device into a safe state.

In an embodiment, a system comprises a first device of the aforementioned type and a second device comprising a second time generator. In this system, the second device is designed to transmit as the external time signal a time signal produced by the second time generator to the first device. The first device of the system can advantageously use the generator unit in the first device to generate a generated time signal which approximates the external time signal provided by the second device. Thus by the generated time signal a time signal having a similar quality to the external time signal produced by the second time generator of the second device is available to the first device of the system without the first device needing to be equipped for this purpose with a time generator that has the same quality as the second time generator of the second device.

In an embodiment of the system, the second time generator has a redundant design. The second time generator can thus advantageously comply with standards for safety-related applications.

In an embodiment of the system, the first device and the second device are connected to one another via a communications link. The second device of the system can advantageously transmit as the external time signal the time signal produced by the second time generator of the second device to the first device of the system via the communications link. The communications link can be designed as a secure communications link, for example.

In an embodiment of the system, the system is designed to transmit as the external time signal the time signal produced by the second time generator to the first device at equidistant synchronization times. This can advantageously simplify the generation of the time signal generated by the generator unit.

The invention claimed is:

1. A device comprising:
a first time generator for generating an internal time signal,
a unit for receiving an external time signal at discrete synchronization times, and
a generator unit for producing a generated time signal, wherein the generator unit is designed to calculate on the basis of an algorithm the generated time signal at a determination time between two synchronization times from a value of the external time signal at a previous synchronization time and from a value of the internal time signal at the determination time,
wherein the algorithm includes an assumption of a proportionality between an advance in the internal time signal and an advance in the external time signal;
wherein the algorithm includes the assumption that a ratio of advances in the external time signal and in the internal time signal between the last synchronization time and the determination time equals a ratio of advances in the external time signal and in the internal time signal between the next-to-last synchronization time and the last synchronization time; and
wherein the algorithm is designed to calculate the generated time signal at the determination time as the sum of a value of the external time signal at the last synchronization time and of a product formed by multiplying the advance in the internal time signal between the last synchronization time and the determination time with the ratio of the advance in the external time signal between the next-to-last synchronization time and the last synchronization time to the advance in the internal time signal between the next-to-last synchronization time and the last synchronization time.

2. The device as claimed in claim 1, wherein the generator unit is designed to set the generated time signal equal to the external time signal at the synchronization times.

3. The device as claimed in claim 1, wherein the generator unit is designed to take into account an overrun of the value of the external time signal and/or of the value of the internal time signal.

4. The device as claimed in claim 1, wherein the generator unit is designed to calculate a first quality value at a synchronization time, wherein the first quality value is calculated as the difference of the value of the generated time signal, which value is calculated for the synchronization time on the basis of the algorithm, and the value of the external time signal at the synchronization time.

5. The device as claimed in claim 4, wherein the device is designed to produce a control signal if the first quality value differs from the value zero by more than a specified first threshold value.

6. The device as claimed in claim 1,
wherein the generator unit is designed to calculate a second quality value at a synchronization time,
wherein the second quality value is calculated as the product of the ratio of the advance in the internal time signal between the last synchronization time and the present synchronization time to the advance in the internal time signal between the next-to-last synchronization time and the last synchronization time, and the ratio of the advance in the external time signal between the next-to-last synchronization time and the last synchronization time to the advance in the external time signal between the last synchronization time and the present synchronization time.

7. The device as claimed in claim 6, wherein the device is designed to produce a control signal if the second quality value differs from the value one by more than a specified second threshold value.

8. The device as claimed in claim 1,
wherein the generator unit is designed to calculate a third quality value at a determination time,
wherein the third quality value is calculated as the difference between the value of the internal time signal at the determination time and a value of the internal time signal at a previous determination time.

9. The device as claimed in claim 8, wherein the device is designed to produce a control signal if the third quality value is not greater than or equal to zero.

10. A system comprising a first device as claimed in claim 1, and further comprising
a second device, which comprises a second time generator, wherein the second device is designed to transmit as the external time signal a time signal produced by the second time generator to the first device.

11. The system as claimed in claim 10, wherein the second time generator has a redundant design to that of the first time generator.

12. The system as claimed in claim 10, wherein the first device and the second device are connected to one another via a communications link.

13. The system as claimed in claim 10, wherein the system is designed to transmit as the external time signal the time signal produced by the second time generator to the first device at equidistant synchronization times.

* * * * *